United States Patent
Itoh

(10) Patent No.: US 7,531,920 B2
(45) Date of Patent: May 12, 2009

(54) DRIVING CIRCUIT

(75) Inventor: Makoto Itoh, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 11/715,431

(22) Filed: Mar. 8, 2007

(65) Prior Publication Data

US 2007/0285863 A1 Dec. 13, 2007

(30) Foreign Application Priority Data

Mar. 31, 2006 (JP) ............................. 2006-098545

(51) Int. Cl.
*H01H 19/64* (2006.01)
*H01H 31/10* (2006.01)
*H01H 33/52* (2006.01)
*H01H 33/59* (2006.01)
*H01H 47/00* (2006.01)
*H01H 85/46* (2006.01)

(52) U.S. Cl. ...................................... 307/113; 307/115
(58) Field of Classification Search ................. 307/113, 307/115–116, 10.1
See application file for complete search history.

(56) References Cited

U.S. PATENT DOCUMENTS

| 6,140,806 | A | * | 10/2000 | Gohara | ........................ 323/282 |
| 7,100,368 | B2 | | 9/2006 | Ito et al. | |
| 7,196,553 | B2 | * | 3/2007 | Umeki | ........................ 327/74 |
| 2005/0210866 | A1 | * | 9/2005 | Ito et al. | ........................ 60/277 |

FOREIGN PATENT DOCUMENTS

JP A-2004-215415 7/2004

* cited by examiner

*Primary Examiner*—Stephen W Jackson
*Assistant Examiner*—Carlos Amaya
(74) *Attorney, Agent, or Firm*—Posz Law Group, PLC

(57) ABSTRACT

When a driving signal changes from L level to H level, a switching circuit is turned on. Then, a gate current flows from a booster circuit to MOSFET through the switching circuit and a resistor. A gate monitor circuit outputs a drive abnormality detection signal of L level when the gate current exceeds a predetermined threshold value. A switching circuit and MOSFET are also similarly driven by a driving signal, and a gate monitor circuit also similarly outputs a drive abnormality detection signal of the L level. When the drive abnormality detection signal changes to the L level, the driving signals are brought to the L level, and the MOSFETs are separated from the booster circuit.

17 Claims, 5 Drawing Sheets

-PRIOR ART-

DRIVING CIRCUIT

CROSS REFERENCE TO RELATED APPLICATION

This application is based on and incorporates herein by reference Japanese Patent Application No. 2006-98545 filed on Mar. 31, 2006.

FIELD OF THE INVENTION

The present invention relates to a driving circuit that drives multiple semiconductor switching devices by a common driving voltage supplied from a driving power source.

BACKGROUND OF THE INVENTION

Various electric loads are used in vehicles. For instance, as disclosed in U.S. Pat. No. 7,100,368 (JP 2005-307957A), a motor-driven air pump and an air switching valve are used in a secondary air injection system for introducing secondary air into an exhaust air path upstream of a catalyst for purifying exhaust gas of an engine. This system includes two N-channel power MOSFETs that respectively drive a motor (load) for driving the air pump and an electromagnetic coil (load) for driving an electromagnetic valve; and one booster circuit required for using these MOSFETs as high-side switches. By sharing the booster circuit between the two MOSFETs, cost reduction is achieved.

In cases where a fault occurs in one of the two MOSFETs in gate-source short-circuiting mode in this system, the following takes place: the output current of the booster circuit that supplies gate current is increased, and the output voltage of the booster circuit extraordinarily drops. As a result, the gate voltage of the other device also drops, and the fault that occurred in one device has an influence on the other device. This is also true in cases where one booster circuit is shared among three or more switching devices.

The above system is so constructed that the following operation is performed: the drain-source voltage of each of the two MOSFETs is monitored with an output monitor circuit to detect short-circuit failure or break failure in a load; when a fault is detected, the gate is turned off to forcibly stop energization. In cases where there is no fault in loads, a state in which an on-drive signal is supplied but the drain-source voltage does not drop is monitored. Thus, gate-source short-circuit failure can be detected using the above output monitor circuit.

However, in cases where break failure has occurred or is about to occur in a load, the drain-source voltage is constantly low regardless of the level of a driving signal. It is difficult to discriminate this from a normal on-state. Thus, the gate-source short-circuit failure (short-circuit failure at a control terminal) cannot be detected with the above output monitor circuit. As a result, a fault will have an influence on another device.

In JP 2004-215415A, in a circuit in which a plurality of power semiconductor elements is connected in parallel, a gate resistor is forcibly cut off by heat even when one or more gates of the power semiconductor elements is short-circuited due to aging or deterioration. Thus, other semiconductor elements are protected from being influenced and can continue to operate. However, the gate resistor need be formed of easily fusible material. Such a gate resistor is likely to be cut off by heat even with various noises that are generated in a vehicle. Thus, the fusible gate resistor lacks robustness against noises.

SUMMARY OF THE INVENTION

It is therefore an object of the invention to provide a driving circuit that drives multiple semiconductor switching devices by common driving voltage, wherein short-circuit failure at a control terminal of each semiconductor switching device can be detected without fail and faults can be prevented from having an influence on other devices.

According to one aspect of the present invention, a driving circuit drives a plurality of semiconductor switching devices by common driving voltage of a common driving power source. The driving circuit comprises switching circuits, current detection circuits, drive abnormality detection circuits and a drive control circuit. The switching circuits are respectively provided for driving current paths from the driving power source to control terminals of the semiconductor switching devices. The current detection circuits respectively detect driving currents flowing from the driving power source to the control terminals of the semiconductor switching devices. The drive abnormality detection circuits respectively output drive abnormality detection signals when the driving currents for the semiconductor switching devices detected by the current detection circuits, exceeds predetermined threshold values. The drive control circuit respectively brings the switching circuits, through which the driving currents higher than the predetermined threshold values flow, into open states when the drive abnormality detection signals are outputted from the drive abnormality detection circuits.

According to another aspect of the present invention, a driving circuit drives a plurality of semiconductor switching devices by common driving voltage supplied from a common driving power source. The driving circuit comprises constant voltage circuits, switching circuits current detection circuits, drive abnormality detection circuits and a drive control circuit. The constant voltage circuits are provided for the semiconductor switching devices, and inputted with the common driving voltage to output constant driving voltages, respectively. The switching circuits are provided for driving current paths from the driving power source to the constant voltage circuits. The current detection circuits respectively detect driving currents flowing from the driving power source to the constant voltage circuits. The drive abnormality detection circuits respectively output drive abnormality detection signals when the driving currents for the semiconductor switching devices, detected by the current detection circuits, exceed predetermined threshold values. The drive control circuit respectively brings the switching circuits, through which the driving currents higher than the predetermined threshold values flow, into open states when the drive abnormality detection signals are outputted from the drive abnormality detection circuits.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

First Embodiment

Figure 1:
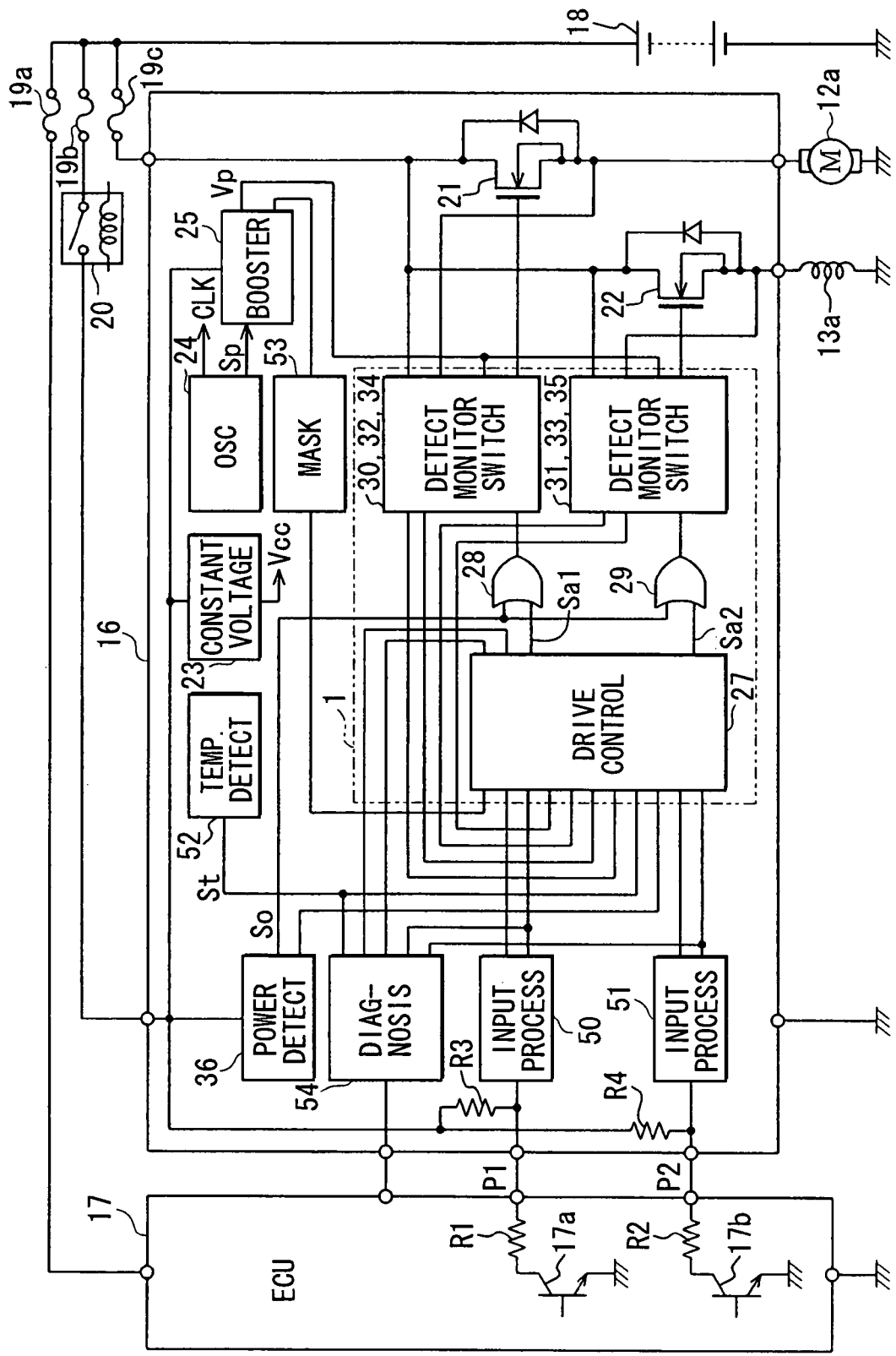
FIG. 1 is a circuit diagram illustrating a driving device including a driving circuit according to a first embodiment of the invention.
Figure 2:
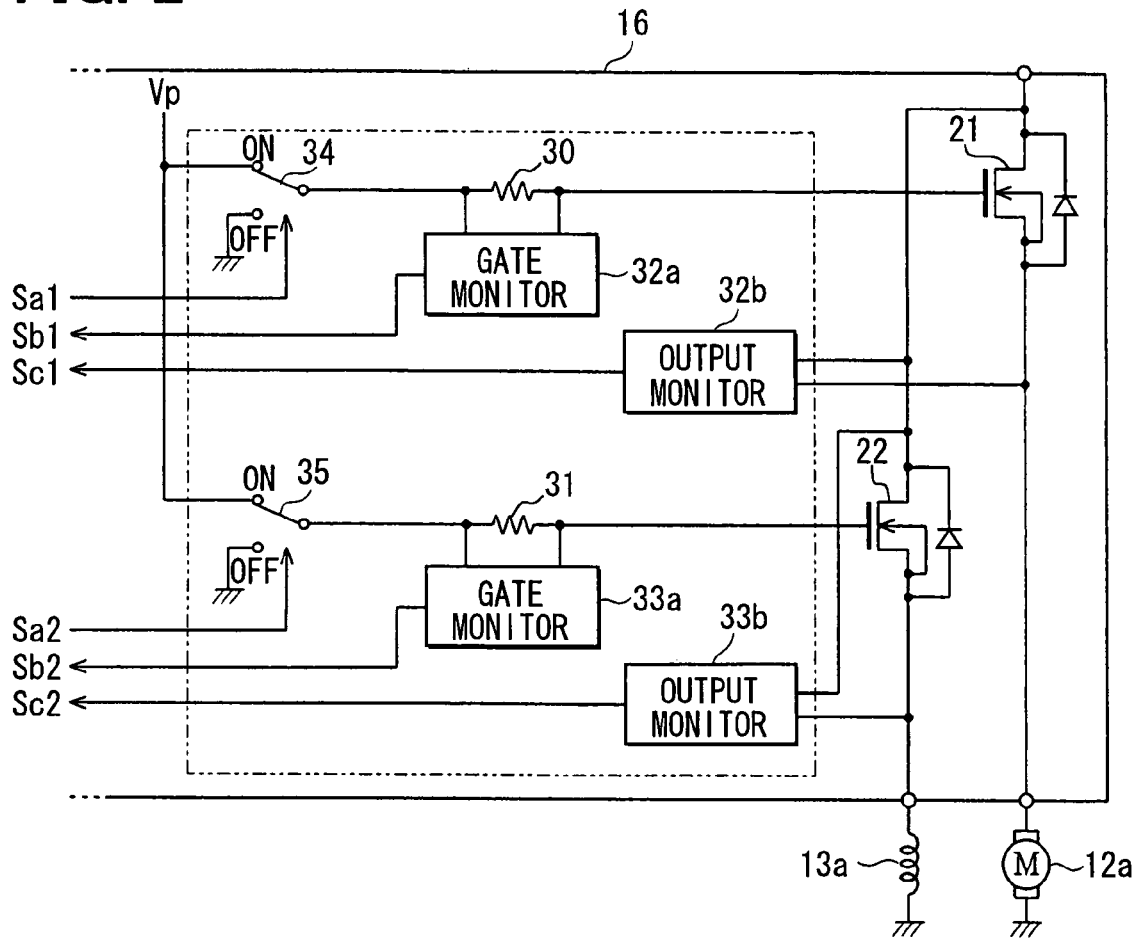
FIG. 2 is a circuit diagram illustrating the driving circuit in the first embodiment.

Referring first to FIG. 1, a driving circuit according to a first embodiment is shown with reference numeral 1 as a part of a driving device 16, which drives electric loads such as an electric motor 12a and an electromagnetic coil 13a with electric power of a vehicle-mounted battery 18. The electric motor 12a and the electromagnetic coil 13a are used in a secondary air supply system of a multi-cylinder gasoline engine 100 as shown in FIG. 5.

Figure 5:
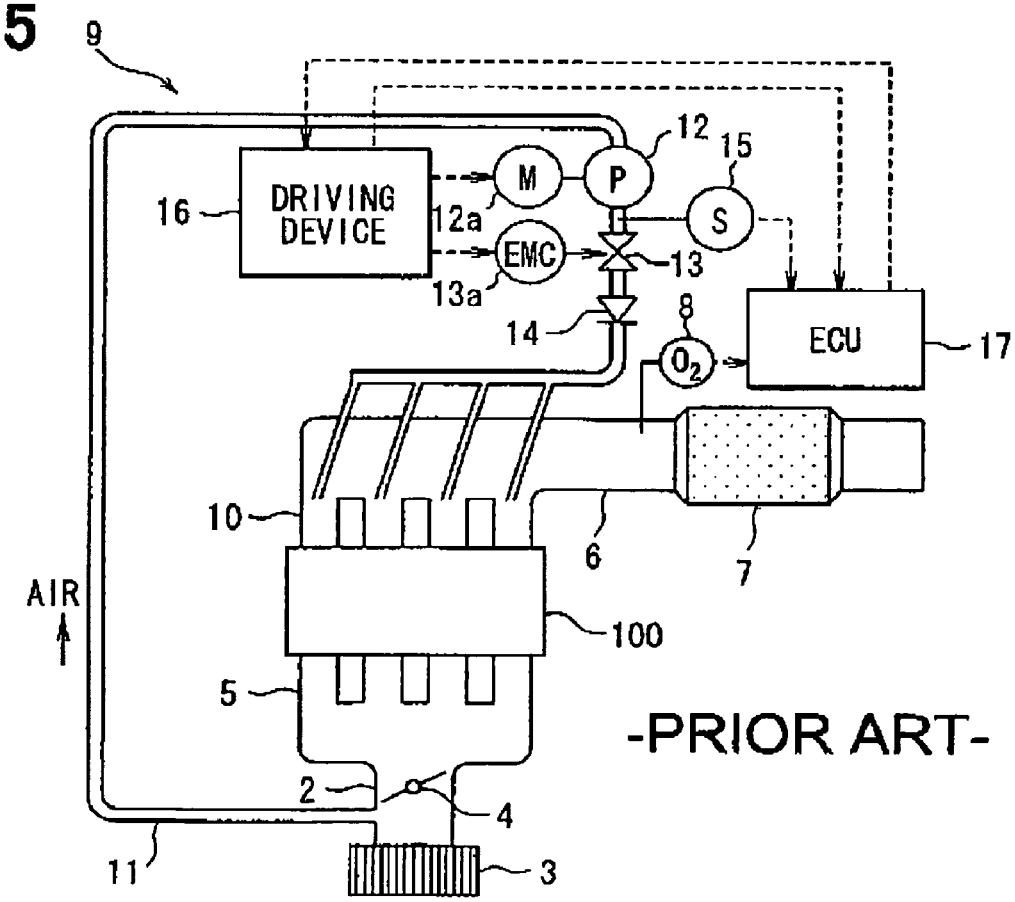
FIG. 5 is a schematic diagram illustrating a secondary air injection system of an engine to which the present invention may be applied.

In the example illustrated in FIG. 5, an intake pipe 2 of the engine 100 is provided at its most upstream portion with an air filter 3, and a throttle valve 4 is provided downstream the air filter 3. A fuel injection valve, not shown, is disposed in proximity to the intake ports of an intake manifold 5 of the engine 100. In an exhaust pipe 6 of the engine 100, for example, a three-way catalyst 7 is disposed for purifying exhaust gas. Upstream of this catalyst 7, an $O_2$ sensor 8 is disposed for detecting the concentration of oxygen in exhaust gas.

A secondary air feeding device 9 includes a secondary air feeding pipe 11 that connects a position upstream of the throttle valve 4 in the intake pipe 2 and a position (particularly, exhaust ports in an exhaust manifold 10) upstream of the $O_2$ sensor 8 in the exhaust pipe 6. In this secondary air feeding pipe 11, there are disposed an air pump 12 driven by the motor 12a, an electromagnetic valve 13 driven by the electromagnetic coil 13a, and a check valve 14 in this order from the upstream side. Further, between the air pump 12 and the electromagnetic valve 13, there is disposed a pressure sensor 15.

A driving device 16 for the secondary air injection system drives the air pump 12 and the electromagnetic valve 13 based on drive instruction signals from an engine control ECU 17. The ECU 17 is supplied with detection signals from the $O_2$ sensor 8, the pressure sensor 15, and the like.

In the driving device 16, as shown in FIG. 1, electric power for the ECU 17 is supplied from the battery 18 through a fuse 19a, and power for the driving device 16 is supplied from the battery 18 through a fuse 19b and a main relay 20 that is turned on and off by an ignition switch (not shown).

Power for the motor 12a for driving the air pump 12 is supplied from the battery 18 through a fuse 19c and an N-channel power MOSFET 21. Power for the electromagnetic coil 13a for driving the electromagnetic valve 13 is supplied from the battery 18 through the fuse 19c and an N-channel power MOSFET 22. The MOSFETs 21, 22 as semiconductor switching devices function as high-side switches, and the motor 12a and the electromagnetic coil 13a correspond to loads.

The drive device 16 is constructed as a hybrid IC in which the MOSFETs 21, 22 and the circuit devices described below are encapsulated in one and the same package. That is, a constant voltage circuit 23 supplied with power through the main relay 20 supplies a constant power supply voltage Vcc to each circuit device in the drive device 16. An oscillation circuit 24 generates a reference clock signal CLK required for operating a logic circuit portion in the drive device 16 as well as a pulse signal Sp required for operating a booster circuit 25. The reference clock signal CLK is used as a timing signal for determining detection times in detecting an overcurrent and the breakage of lines.

The booster circuit 25, which corresponds to a driving power source, is provided in common for the MOSFETs 21, 22 and the like. It boosts the power supply voltage (voltage inputted through the main relay 20) by switching operation based on the pulse signal Sp, and it supplies the boosted voltage Vp (corresponding to the common driving voltage) to the driving circuit 1.

The driving circuit 1 is constructed with a drive control circuit 27, OR circuits 28, 29, resistors 30, 31 (corresponding to the current detection circuits), monitor circuits 32, 33, and switching (open/close) circuits 34, 35. Driving signals Sa1, Sa2 outputted from the drive control circuit 27 are respectively supplied to the switching circuits 34, 35 through the OR circuits 28, 29. To one input terminal of each of the OR circuits 28, 29, there is inputted an overvoltage detection signal So outputted from a power supply voltage detection circuit 36.

Figure 3:
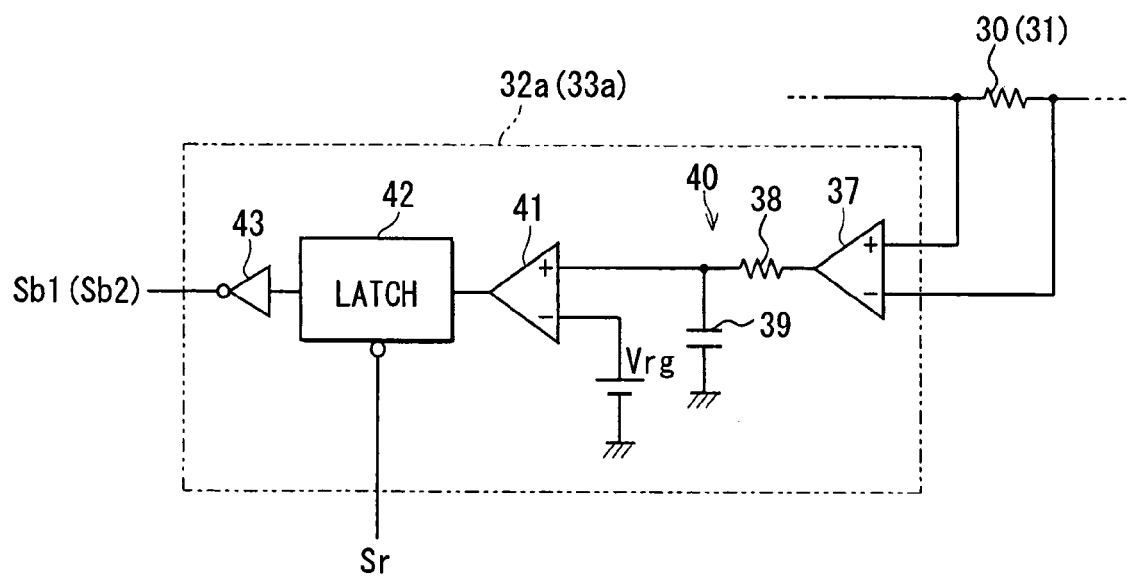
FIG. 3 is a circuit diagram illustrating a gate monitor circuit in the first embodiment.

The resistors 30, 31 (current detection circuits), monitor circuits 32, 33, and switching circuits 34, 35 are shown in detail in FIG. 3. In the driving current path from the booster circuit 25 to the gate (control terminal) of the MOSFET 21, there are provided the switching circuit 34 and the resistor 30 in series. The switching circuit 34 is constructed of a semiconductor switch and is so constructed that it operates as follows: when the driving signal Sa1 is at a high (H) level, it is turned on and supplies the boosted voltage Vp to the gate; when the driving signal Sa1 is at a low (L) level, it is turned off and supplies the ground potential to the gate.

In the driving current path from the booster circuit 25 to the gate of the MOSFET 22, similarly, there are provided the switching circuit 35 and the resistor 31 in series. The switching circuit 35 is constructed of a semiconductor switch and is so constructed that it operates as follows: when the driving signal Sa2 is at the H level, it is turned on and supplies the boosted voltage Vp to the gate; when the driving signal Sa2 is at the L level, it is turned off and supplies the ground potential to the gate.

Gate monitor circuits 32a, 33a are drive abnormality detection circuits and respectively output drive abnormality detection signals Sb1, Sb2 of the L level when the gate currents (corresponding to driving currents) passed through the respective driving current paths exceed a predetermined threshold value. Specifically, they have the construction illustrated in FIG. 3. That is, both terminals of the resistor 30 (or 31) are respectively connected with the input terminals of a differential amplifier circuit 37; the output terminal of each differential amplifier circuit 37 is connected to the non-inverting input terminal of a comparator 41 through a low pass filter 40 constructed of a resistor 38 and a capacitor 39. The inverting input terminal of the comparator 41 is supplied with a reference voltage Vrg corresponding to the threshold value for the gate current. The output signal of the comparator 41 is outputted as a drive abnormality detection signal Sb1 (Sb2) through a latch circuit 42 and an inverter 43. The latch circuit 42 is reset by a power-on reset signal Sr. At this time, the drive abnormality detection signals Sb1, Sb2 are initialized to the H level.

The output monitor circuits 32b, 33b (corresponding to load abnormality detection circuits) are respectively provided so as to detect the source-drain voltage (corresponding to the voltage between main terminals) of the corresponding MOSFETs 21, 22. The output monitor circuits 32b, 33b are so constructed as to perform the following operation: they perform the operation for detecting abnormalities associated with a load, such as load short-circuiting and load break, based on their detecting voltage and a detection time generated from a reference clock signal CLK from the oscillation circuit 24; when an abnormality detection state arises, they supply load abnormality detection signals Sc1, Sc2 of the L level to the drive control circuit 27.

Figure 4:
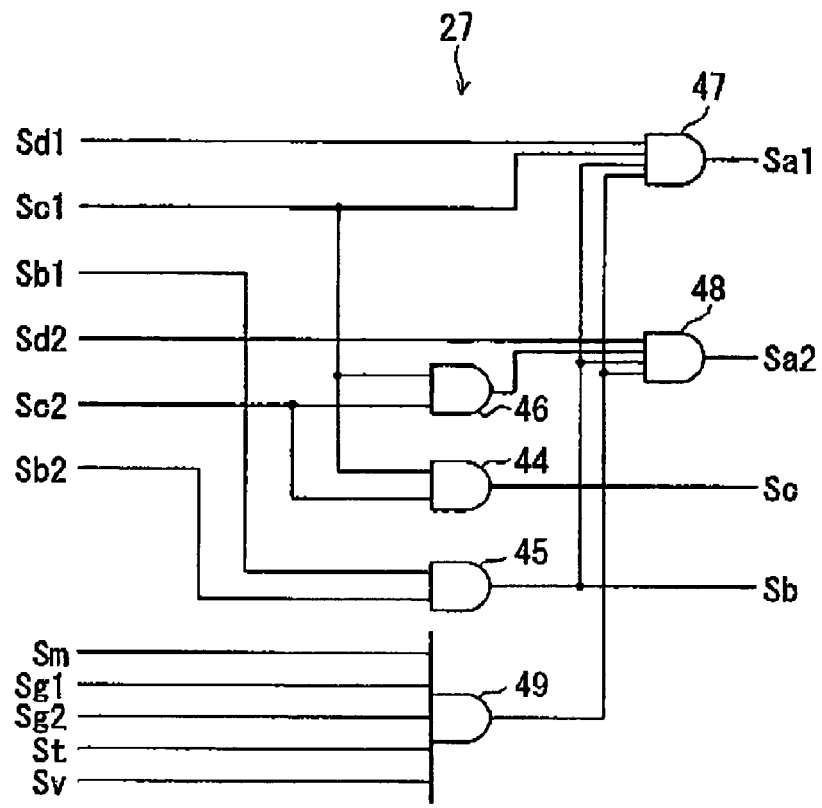
FIG. 4 is a circuit diagram illustrating a drive control circuit in the first embodiment.

As illustrated in FIG. 4, the drive control circuit 27 is constructed of AND circuits 44 to 49. It is so constructed that the following are inputted or outputted: in addition to the above drive abnormality detection signals Sb1, Sb2 and load abnormality detection signals Sc1, Sc2, the drive control signals Sd1, Sd2, mask signal Sm, short-circuit detection signal Sg1, Sg2, temperature abnormality detection signal St, and voltage abnormality detection signal Sv described below are inputted thereto; and it outputs the driving signals Sa1, Sa2, drive abnormality detection signal Sb, and load abnormality detection signal Sc described below. This is expressed by logical expressions as follows:

Driving signal
  $Sa1 = Sd1 \cdot Sc1 \cdot Sb1 \cdot Sb2 \cdot Sm \cdot Sg1 \cdot Sg2 \cdot St \cdot Sv$ Driving signal
  $Sa2 = Sd2 \cdot Sc1 \cdot Sc2 \cdot Sb1 \cdot Sb2 \cdot Sm \cdot Sg1 \cdot Sg2 \cdot St \cdot Sv$ Drive abnormality detection signal $Sb = Sb1 \cdot Sb2$ Load abnormality detection signal $Sc = Sc1 \cdot Sc2$ The motor 12a and the electromagnetic coil 13a as loads are different from each other in degree of importance when an abnormality (fault) occurs. Abnormalities that may occur in the motor 12a have greater influence on the secondary air injection system than abnormalities that may occur in the electromagnetic coil 13a have. For this reason, a higher priority is assigned to the motor 12a than to the electromagnetic coil 13a. When an abnormality occurs in the motor 12a and the load abnormality detection signal Sc1 changes to the L level, the drive control circuit 27 brings the driving signals Sa1, Sa2 to the L level and turns off both the MOSFETs 21, 22. Meanwhile, when an abnormality occurs in the electromagnetic coil 13a and the load abnormality detection signal Sc2 changes to the L level, the drive control circuit 27 brings the driving signal Sa2 to the L level and turns off only the MOSFET 22.

The driving device 16 is connected to an electronic control unit (ECU) 17. The ECU 17 is so constructed that it performs the following operation: it selectively outputs a drive instruction signal and a stop instruction signal for the air pump 12 from its output terminal PI and supplies them to an input signal processing circuit 50; further, it selectively outputs a drive instruction signal and a stop instruction signal for the electromagnetic valve 13 from its output terminal P2 and supplies them to an input signal processing circuit 51.

In this case, the drive instruction signals are so constructed that the following is implemented: they are respectively outputted when NPN transistors 17a and 17b provided in the output stage of the ECU 17 are in the ON state. The stop instruction signals are so constructed that the following is implemented: they are respectively outputted when the transistors 17a and 17b are in the OFF state. Voltage-dividing resistors R1 and R2 are provided between the collectors of the transistors 17a and 17b and the output terminals P1 and P2; pull-up resistors R3 and R4 connected to the power source are respectively provided on the side of the input terminals of the input signal processing circuits 50 and 51. As a result, drive instruction signals of the intermediate voltage level (voltage level produced by dividing the power supply voltage) are respectively outputted from the output terminals P1 and P2 during the ON period of the transistors 17a and 17b; stop instruction signals of the power supply voltage level are respectively outputted from the output terminals PI and P2 during the OFF period of the transistors 17a and 17b.

Therefore, the input signal processing circuit 50 outputs a drive control signal Sd1 of the H level when the drive instruction signal (intermediate voltage level) is inputted from the output terminal P1 of the ECU 17; and it outputs the drive control signal Sd1 of the L level when the stop instruction signal (power supply voltage level) is inputted from the output terminal P1. The input signal processing circuit 51 outputs the drive control signal Sd2 of the H level when the drive instruction signal is inputted from the output terminal P2 of the ECU 17; and it outputs the drive control signal Sd2 of the L level when the stop instruction signal is inputted from the output terminal P2.

In cases where an input signal line that connects the output terminal P1 of the ECU 17 and the input signal processing circuit 50 of the drive device 16 is short-circuited to a chassis or the like, the input voltage of the input signal processing circuit 50 drops to the ground potential. The input signal processing circuit 50 is so constructed as to output a short-circuit detection signal Sg1 of the L level at this time. In cases where the input signal line that connects the output terminal P2 of the ECU 17 and the input signal processing circuit 51 of the drive device 16 is short-circuited to the chassis or the like, the input voltage of the input signal processing circuit 51 drops to the ground potential. The input signal processing circuit 51 is so constructed as to output a short-circuit detection signal Sg2 of the L level at this time.

The power supply voltage detection circuit 36 is provided for detecting any abnormality in the power supply voltage of the drive device 16. When it detects instantaneous abnormal rise of power supply voltage caused by surge voltage arising from load dump or the like, it outputs an overvoltage detection signal So of the H level to the OR circuits 28, 29. The driving signals Sa1, Sa2 outputted from the OR circuits 28, 29 rise to the H level in response thereto. Therefore, the MOSFETs 21 and 22 are forcibly turned on, and thus the motor 12a and the electromagnetic coil 13a as loads are energized and the abnormal rise of power supply voltage is suppressed. The state in which the MOSFETs 21 and 22 are forcibly turned and kept on is sustained only until the overvoltage detection signal So returns to the L level.

The power supply voltage detection circuit 36 is so constructed as to perform the following operation: when overvoltage is detected at a jump start and when abnormal power supply voltage drop is detected, it outputs a voltage abnormality detection signal Sv of the L level. Thus, when overvoltage associated with the jump start is applied or when abnormal power supply voltage drop occurs, energization of the motor 12a and the electromagnetic coil 13a is forcibly stopped.

A temperature detection circuit 52 is provided for detecting the temperature of, for example, a substrate that constructs the drive device 16. It is so constructed as to perform the following operation: when its detected temperature exceeds a preset upper-limit temperature, it outputs a temperature abnormality detection signal St of the L level. Therefore, when abnormal temperature rise occurs in the drive device 16, energization of the motor 12a and the electromagnetic coil 13a is forcibly stopped.

A mask circuit 53 outputs a mask signal Sm of the L level only until the output voltage of the booster circuit 25 is stabilized after the power to the drive device 16 is turned on. Therefore, the operations of the MOSFETs 21, 22 are prevented from being destabilized, until the output voltage of the booster circuit 25 is stabilized.

A diagnosis circuit 54 is provided for outputting a diagnosis signal related to the drive device 16 to the ECU 17 as a higher level system. The diagnosis circuit 54 is supplied with the following: the drive abnormality detection signal Sb and load abnormality detection signal Sc from the drive control circuit 27; the short-circuit detection signals Sg1, Sg2 from the input signal processing circuits 50, 51; and the temperature abnormality detection signal St from the temperature detection circuit 52.

The drive control signals Sd1, Sd2 outputted from the ECU 17 through the input signal processing circuits 50, 51 directly become driving signals Sa1, Sa2 in the following cases: cases where the drive abnormality detection signals Sb1, Sb2, load abnormality detection signals Sc1, Sc2, short-circuit detection signals Sg1, Sg2, temperature abnormality detection signal St, voltage abnormality detection signal Sv, and mask signal Sm are all at the H level; and at the same time, the overvoltage detection signal So is at the L level.

For example, when the drive control signal Sd1 changes from the L level to the H level in this case, the switching circuit 34 is turned on. Thus, a gate current flows from the booster circuit 25 to the MOSFET 21 through the switching circuit 34 and the resistor 30. When the MOSFET 21 is normal, the gate current flows only during a short period until the gate capacitance is charged. Meanwhile, when short-circuit failure has occurred between the gate and source of the MOSFET 21, the gate current supplied from the booster circuit 25 is considerably increased, and continues to flow as long as the switching circuit 34 is in the ON state.

The gate monitor circuit 32a performs the following operation when the voltage across the resistor 30 proportional to the gate current exceeds the reference voltage Vrg, that is, the gate current exceeds a predetermined threshold value: the gate monitor circuit 32a actuates its latch circuit 42, and outputs a latched drive abnormality detection signal Sb1 of the L level. Since the gate monitor circuit 32a has the low-pass filter 40, the drive abnormality detection signal Sb1 is not brought to the L level only by the charging current for the gate capacitance. This operation is the same as the switching circuit 35 and the gate monitor circuit 33a.

When the drive abnormality detection signal Sb1 changes to the L level, the drive control circuit 27 brings the driving signals Sa1, Sa2 and the drive abnormality detection signal Sb to the L level. When the driving signals Sa1, Sa2 are brought to the L level, the switching circuits 34, 35 are turned off, and the booster circuit 25 and the gates of the MOSFETs 21, 22 are separated from each other. This prevents the output current of the booster circuit 25 from becoming too large, and makes it possible to prevent drop in the boosted voltage Vp.

In this embodiment, when gate-source short-circuit failure occurs in either of the MOSFETs 21, 22, the MOSFETs 21, 22 are both turned off. Instead, the embodiment may be so modified that only a faulty MOSFET (e.g., MOSFET 21) is turned off. With this construction, only the MOSFET 21 in which gate-source short-circuit failure has occurred is separated from the booster circuit 25. Therefore, the other MOSFET 22 can continuously perform turn-on/off operation under the supply of normal boosted voltage Vp from the booster circuit 25. Also, in this embodiment, any other N-channel MOSFET (not shown) may be driven by the boosted voltage Vp in some cases. In such a case, the other MOSFET can continuously perform normal turn-on/off operation without being influenced by the gate-source short-circuit failure that has occurred in the MOSFET 21 or 22.

As described above, the drive device 16 in this embodiment has the single booster circuit 25, and drives the MOSFETs 21, 22 using the common boosted voltage Vp outputted from the booster circuit 25. Therefore, its construction can be simplified and its number of components can be reduced by sharing voltage-boosted power supply. Further, the number of booster circuits, which are a source of switching noise, is reduced, and measures against noise are made easier to take.

The MOSFETs 21, 22 are respectively provided with the gate monitor circuits 32a, 33a, and the drive abnormality detection signals Sb1, Sb2 are made active (brought to the L level) when the gate currents flowing from the booster circuit 25 to the MOSFETs 21, 22 exceed a predetermined threshold value. Therefore, gate-source short-circuit failure in the MOSFETs 21, 22 can be detected without fail even when some abnormality (short-circuit failure, break failure) has occurred in the motor 12a or the electromagnetic coil 13a as a load.

When gate-source short-circuit failure occurs in MOSFET 21 or 22, the drive control circuit 27 turns off the switching circuits 34, 35 to separate the booster circuit 25 and the gates of the MOSFETs 21, 22 from each other. This makes it possible to prevent increase in the output current of the booster circuit 25 and drop in the boosted voltage Vp. It is possible to prevent gate-source short-circuit failure in MOSFET 21, 22 from having an influence on any other circuit that operates using the booster circuit 25.

The drive control circuit 27 logically combines the drive control signals Sd1, Sd2 and various abnormality detection signals to generate the driving signals Sa1, Sa2. The abnormality detection signals include the drive abnormality detection signals Sb1, Sb2, load abnormality detection signals Sc1, Sc2, mask signal Sm, short-circuit detection signals Sg1, Sg2, temperature abnormality detection signal St, and voltage abnormality detection signal Sv.) The switching circuits 34, 35 are turned on and off by these driving signals Sa1, Sa2. Therefore, each of the driving current paths from the booster circuit 25 to the MOSFETs 21, 22 only has to be provided with one switching circuit 34, 35. This construction can be made simpler than the construction in which a switching circuit is provided for each of the drive control signals Sd1, Sd2 and the various abnormality detection signals.

Priorities are set for the motor 12a and the electromagnetic coil 13a as loads. In cases where an abnormality occurs in the motor 12a with the higher degree of importance in the system, the drive control circuit 27 carries out control so as to turn off both the switching circuits 34, 35. Thus, the control on the change of the switching circuits 34, 35 into open (OFF) state is weighted according to priorities, and cooperative and integral control in which various abnormality detection signals are determined in a comprehensive manner can be implemented. When a fault occurs in the motor 12a with the higher degree of importance, the secondary air injection system can be protected with reliability, and a highly reliably system can be built.

Second Embodiment

Figure 6:
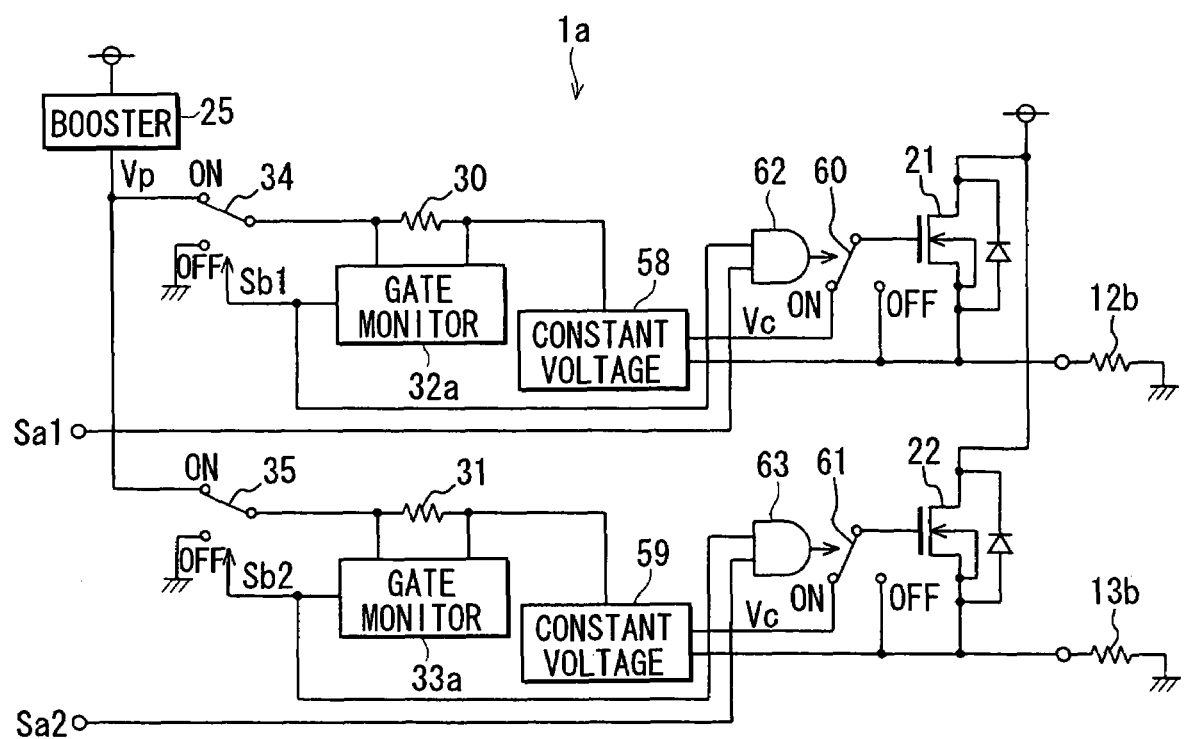
FIG. 6 is a circuit diagram illustrating a driving circuit according to a second embodiment of the invention.

In a second embodiment, as shown in FIG. 6, a driving circuit 1a drives two MOSFETs 21, 22 that function as high-side switches, based on the common boosted voltage Vp supplied from the booster circuit 25. Resistors 12b, 13b respectively represent loads connected between the sources of the MOSFETs 21, 22 and ground.

Constant voltage circuits 58, 59 are inputted with the boosted voltage Vp and output a constant driving voltage Vc, and are individually provided for the MOSFETs 21, 22. In the driving current path from the booster circuit 25 to the constant voltage circuit 58, there are provided the switching circuit 34 (corresponding to first switching circuit) and the resistor 30 (corresponding to current detection circuit) in series. In the driving current path from the constant voltage circuit 58 to the gate of the MOSFET 21, there is provided a switching circuit 60 (corresponding to second switching circuit). The gate monitor circuit 32$a$ outputs the drive abnormality detection signal Sb1 of the L level when the gate current passed through the resistor 30 exceeds the predetermined threshold value. The switching circuit 34 is so constructed that it is directly turned on and off by this drive abnormality detection signal Sb1. The switching circuit 60 is so constructed that it is turned on and off by the output signal of an AND circuit 62 to which the driving signal Sa1 and the drive abnormality detection signal Sb1 are inputted.

In the driving current path from the booster circuit 25 to the constant voltage circuit 59, similarly, there are provided the switching circuit 35 (corresponding to first switching circuit) and the resistor 31 (corresponding to current detection circuit) in series. In the driving current path from the constant voltage circuit 59 to the gate of the MOSFET 22, there is provided a switching circuit 61 (corresponding to second switching circuit). A gate monitor circuit 33$a$ outputs a drive abnormality detection signal Sb2 of the L level when the gate current passing through the resistor 31 exceeds the predetermined threshold value. The switching circuit 35 is so constructed that it is directly turned on and off by this drive abnormality detection signal Sb2. The switching circuit 61 is so constructed that it is turned on and off by the output signal of an AND circuit 63 to which the driving signal Sa2 and the drive abnormality detection signal Sb2 are inputted.

This second embodiment may also be applied to the secondary air injection system as in the first embodiment. In this case, the following is implemented: various abnormality detection signals are logically combined based on the priorities (the influence of a load abnormality on the system (degree of importance)) of the loads (resistors 12$b$, 13$b$); the switching circuits 34, 35 are driven and turned on and off by the weighted abnormality detection signals, and further the switching circuits 60, 61 are driven and turned on and off by AND signals from the abnormality detection signals and the driving signals Sa1, Sa2.

When there is no gate-source short-circuit failure in the MOSFET 21, the drive abnormality detection signal Sb1 is at the H level. The switching circuit 60 operates as follows: when the driving signal Sa1 is at the H level, it is turned on and supplies the driving voltage Vc to the gate; when the driving signal Sa1 is at the L level, it is turned off and lowers the gate-source impedance. When the switching circuit 60 is turned on, a gate current temporarily flows from the constant voltage circuit 58, and accordingly a driving current also flows from the booster circuit 25 to the constant voltage circuit 58 through the switching circuit 34. The drive abnormality detection signal Sb1 is not brought to the L level only by the charging current for the gate capacitance. The same operation is also performed with respect to the MOSFET 22.

Meanwhile, when short-circuit failure occurs between the gate and source of the MOSFET 21, for example, the output current and input current of the constant voltage circuit 58 are increased, and the drive abnormality detection signal Sb1 is brought to the L level. As a result, the switching circuits 34, 60 are turned off, and the booster circuit 25 and the constant voltage circuit 58 are separated from each other. This prevents the output current of the booster circuit 25 from becoming too large, and makes it possible to prevent drop in the boosted voltage Vp. At this time, the MOSFET 22 in which there is no gate-source short-circuit failure can continuously perform normal turn-on/off operation under the supply of boosted voltage Vp from the booster circuit 25.

Also, in this embodiment, therefore, gate-source short-circuit failure that occurred in either MOSFET 21 or 22 can be prevented from having an influence on the other MOSFET 22 or 21. The other same operation and effect as in the first embodiment can be provided. Further, between the booster circuit 25 and the MOSFETs 21, 22, there are respectively provided the constant voltage circuits 58, 59. Therefore, the MOSFETs 21, 22 can be stably driven by the constant driving voltage Vc even when the boosted voltage VP fluctuates. The boosted voltage Vp is kept supplied from the booster circuit 25 to the constant voltage circuits 58, 59 as long as no drive abnormality is detected. Therefore, switching with a high frequency can be implemented without being influenced by the starting time of the constant voltage circuits 58, 59 or the like.

Third Embodiment

Figure 7:
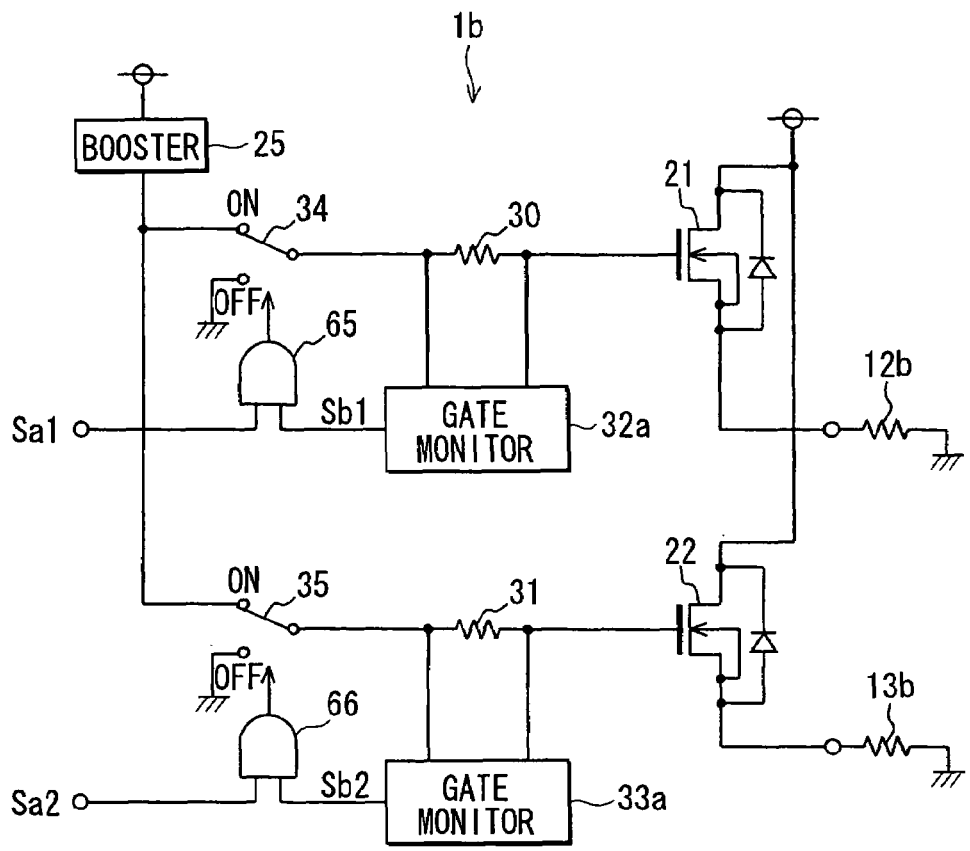
FIG. 7 is a circuit diagram illustrating a driving circuit according to a third embodiment of the invention.

In a third embodiment, as shown in FIG. 7, in a driving circuit 1$b$, the switching circuit 34 is so constructed that it is turned on and off by the output signal of an AND circuit 65 to which the driving signal Sa1 and the drive abnormality detection signal Sb1 are inputted; and the switching circuit 35 is so constructed that it is turned on and off by the output signal of an AND circuit 66 to which the driving signal Sa2 and the drive abnormality detection signal Sb2 were inputted. Also, in this embodiment, the same operation and effect as in the first embodiment are provided. This embodiment may also be applied to the secondary air injection system as the first embodiment.

Fourth Embodiment

Figure 8:
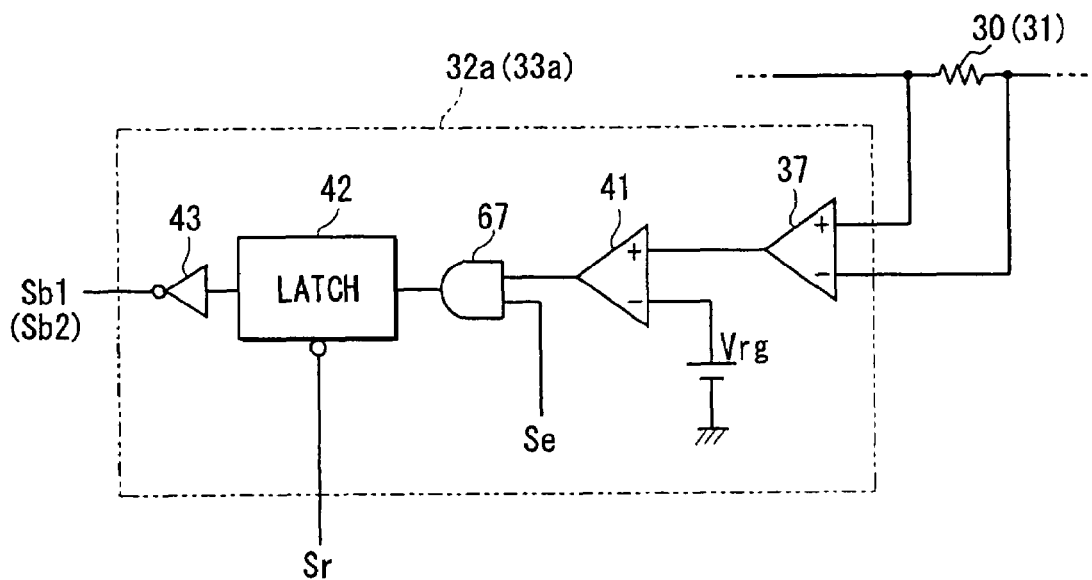
FIG. 8 is a circuit diagram illustrating a gate monitor circuit according to a fourth embodiment of the invention.

In a fourth embodiment, as shown in FIG. 8, an AND circuit 67 is provided between the comparator 41 and the latch circuit 42 in place of the low-pass filter 40 illustrated in FIG. 3, and the output signal of the comparator 41 is masked with the mask signal Se and then supplied to the latch circuit 42.

The mask signal Se used in the gate monitor circuit 32$a$ is a signal that is kept at the L level (invalid level) only for a time required for charging the gate capacitance of the MOSFET 21 after the point of time of level shift of the driving signal Sa1. Similarly, the mask signal Se used in the gate monitor circuit 33$a$ is a signal that is kept at the L level (invalid level) only for a time required for charging the gate capacitance of the MOSFET 22 after the point of time of the level shift of the driving signal Sa2. Use of these gate monitor circuits 32$a$, 33$a$ makes it possible to mask temporary increase in gate current that is not caused by any fault, for example, the charging/discharging current for the gate capacitance, and to prevent the drive abnormality detection signals Sb1, Sb2 from being erroneously outputted.

Other Embodiments

The above embodiments may be modified as described below, for example.

In place of two MOSFETs 21, 22, three or more semiconductor switching devices may be driven by common boosted voltage Vp supplied from one booster circuit 25. In this case, a switching circuit, a current detection circuit, and a gate monitor circuit (drive abnormality detection circuit) can be provided with respect to each of the semiconductor switching devices.

In the first embodiment, the drive control circuit 27 weights the load abnormality detection signals Sc1, Sc2 in the driving signals Sa1, Sa2. This weighting is done based on the degree of importance of the influences a fault in the motor 12a and a fault in the electromagnetic coil 13a respectively have on the system. In the driving signals Sa1, Sa2, similarly, the drive abnormality detection signals Sb1, Sb2 may be weighted and various abnormality detection signals may be weighted.

The second embodiment may be provided with the output monitor circuits 32b, 33b. Further, the invention may be so constructed that the drive control circuit generates signals for opening and closing the switching circuits 34, 35, 60, 61 based on the following: the drive abnormality detection signals Sb1, Sb2 outputted from the gate monitor circuits 32a, 33a and the load abnormality detection signals Sc1, Sc2 outputted from the output monitor circuits 32b, 33b; and the degree of importance (priority) of each load shown as a resistor 12b, 13b.

The above driving circuit 1, 1a, 1b is applicable to an integrated switch or the like provided upstream of the power source for independently driving multiple loads in a vehicle equipped with chassis ground.

What is claimed is:

1. A driving circuit that drives a plurality of semiconductor switching devices by common driving voltage supplied from a driving power source, the driving circuit comprising:
    switching circuits respectively provided for driving current paths from the driving power source to control terminals of the semiconductor switching devices;
    current detection circuits that respectively detect driving currents flowing from the driving power source to the control terminals of the semiconductor switching devices;
    drive abnormality detection circuits that respectively output drive abnormality detection signals, when the driving currents for the semiconductor switching devices detected by the current detection circuits exceeds predetermined threshold values; and
    a drive control circuit that respectively brings the switching circuits, through which the driving currents higher than the predetermined threshold values flow, into open states when the drive abnormality detection signals are outputted from the drive abnormality detection circuits.

2. The driving circuit of claim 1, wherein the drive control circuit opens and closes the switching circuits based on driving signals for the semiconductor switching devices, respectively.

3. The driving circuit of claim 2, wherein the drive abnormality detection circuits invalidate the abnormality detection signals for a predetermined time after a point of time of level shift of the driving signals, respectively.

4. The driving circuit of claim 1, further comprising:
    load abnormality detection circuits that respectively detect load abnormalities in loads of the semiconductor switching devices based on voltages across main terminals of the semiconductor switching devices and output load abnormality detection signals,
    wherein the drive control circuit weights conditions under which the switching circuits change into the open states when abnormalities are detected, based on abnormality detection signals respectively outputted from the drive abnormality detection circuits and the load abnormality detection circuits and priorities set for the loads of the semiconductor switching devices.

5. The driving circuit of claim 1, wherein the drive abnormality detection circuits generate the drive abnormality detection signals by passing the driving currents for the semiconductor switching devices, detected by the current detection circuits, through low-pass filters and then comparing the driving currents with the predetermined threshold values, respectively.

6. The driving circuit of claim 1, wherein the drive control circuit is configured to bring a first one of the switching circuits into the open state when a corresponding first driving current is higher than a first one of the predetermined threshold values, and to bring a second one of the switching circuits into a closed state when a corresponding second driving current is not higher than a second one of the predetermined threshold values.

7. The driving circuit of claim 1, wherein the drive control circuit is configured to bring all of the switching circuits into the open state when one of the driving currents is higher than a corresponding one of the predetermined threshold values.

8. The driving circuit of claim 1, wherein only a corresponding one of the switching circuits is brought into the open state when a corresponding one of the drive abnormality detection circuits detects that a corresponding one of the driving currents exceeds a corresponding one of the predetermined threshold values.

9. The driving circuit of claim 1,
    wherein the semiconductor switching devices includes a first MOS transistor,
    wherein the driving circuit further comprises a first output monitor circuit configured to detect a first source-drain voltage of the first MOS transistor, and
    wherein the first output monitor circuit operates to detect abnormalities associated with a first load connected to the first MOS transistor, based on the detected first source-drain voltage and a detection time generated from a reference clock signal from an oscillation circuit.

10. The driving circuit of claim 1, wherein
    wherein the semiconductor switching devices includes a second MOS transistor,
    wherein the driving circuit further comprises a second output monitor circuit configured to detect a second source-drain voltage of the second MOS transistor, and
    wherein the second output monitor circuit operates to detect second abnormalities associated with a second load connected to the second MOS transistor, based on the detected second source-drain voltage and the detection time generated from the reference clock signal from the oscillation circuit.

11. The driving circuit of claim 1, wherein each of the current detection circuits is connected in series with the driving power source and a corresponding one of the switching circuits.

12. A driving circuit that drives a plurality of semiconductor switching devices by common driving voltage supplied from a driving power source, the driving circuit comprising:
    constant voltage circuits that are provided for the semiconductor switching devices, and inputted with the common driving voltage to output constant driving voltages, respectively;
    first switching circuits provided for driving current paths from the driving power source to the constant voltage circuits;
    current detection circuits that respectively detect driving currents flowing from the driving power source to the constant voltage circuits;
    drive abnormality detection circuits that respectively output drive abnormality detection signals, when the driving currents for the semiconductor switching devices detected by the current detection circuits, exceed predetermined threshold values; and a drive control circuit that respectively brings the switching circuits, through which the driving currents higher than the predetermined threshold values flow, into open states when the drive abnormality detection signals are outputted front, the drive abnormality detection circuits.

13. The driving circuit of claim 12, further comprising:
second switching circuits provided for the driving current paths from the constant voltage circuits to control terminals of the semiconductor switching devices,
wherein the drive control circuit opens and closes, respectively, the second switching circuits based on driving signals for the semiconductor switching devices.

14. The driving circuit of claim 13, wherein the drive abnormality detection circuits invalidate the abnormality detection signals for a predetermined time after a point of time of level shift of the driving signals, respectively.

15. The driving circuit of claim 12, further comprising:
load abnormality detection circuits that respectively detect load abnormalities in loads of the semiconductor switching devices based on voltages across main terminals of the semiconductor switching devices and output load abnormality detection signals,
wherein the drive control circuit weights conditions under which the first switching circuits change into the open states when abnormalities are detected, based on abnormality detection signals respectively outputted from the drive abnormality detection circuits and the load abnormality detection circuits and priorities set for the loads of the semiconductor switching devices.

16. The driving circuit of claim 12, wherein the drive abnormality detection circuits generate the drive abnormality detection signals by passing the driving currents for the semiconductor switching devices, detected by the current detection circuits, through low-pass filters and then comparing the driving currents with the predetermined threshold values, respectively.

17. The driving circuit of claim 12, wherein each of the current detection circuits is connected in series with the driving power source and a corresponding one of the switching circuits.

* * * * *